(12) United States Patent
Kong et al.

(10) Patent No.: US 11,189,724 B2
(45) Date of Patent: Nov. 30, 2021

(54) METHOD OF FORMING A TOP EPITAXY SOURCE/DRAIN STRUCTURE FOR A VERTICAL TRANSISTOR

(71) Applicant: International Business Machines Corporation, Armonk, NY (US)

(72) Inventors: Dexin Kong, Guilderland, NY (US); Kangguo Cheng, Schenectady, NY (US); Shogo Mochizuki, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 163 days.

(21) Appl. No.: 16/169,589

(22) Filed: Oct. 24, 2018

(65) Prior Publication Data

US 2020/0135920 A1   Apr. 30, 2020

(51) Int. Cl.
| | |
|---|---|
| *H01L 29/78* | (2006.01) |
| *H01L 29/66* | (2006.01) |
| *H01L 29/04* | (2006.01) |
| *H01L 29/51* | (2006.01) |
| *H01L 21/768* | (2006.01) |
| *H01L 21/02* | (2006.01) |

(Continued)

(52) U.S. Cl.
CPC .... *H01L 29/7827* (2013.01); *H01L 21/02532* (2013.01); *H01L 21/324* (2013.01); *H01L 21/76829* (2013.01); *H01L 29/045* (2013.01); *H01L 29/0847* (2013.01); *H01L 29/51* (2013.01); *H01L 29/6656* (2013.01); *H01L 29/66666* (2013.01)

(58) Field of Classification Search
CPC .......... H01L 29/66666; H01L 29/6656; H01L 29/7827
See application file for complete search history.

(56) References Cited

U.S. PATENT DOCUMENTS

| | | |
|---|---|---|
| 5,340,759 A | 8/1994 | Hsieh et al. |
| 7,977,154 B2 | 7/2011 | Koshka et al. |
| 8,043,943 B2 | 10/2011 | Maboudian et al. |

(Continued)

OTHER PUBLICATIONS

Appl. Phys. 111, 044908 (2012) (Year: 2012).*

(Continued)

*Primary Examiner* — Jarrett J Stark
(74) *Attorney, Agent, or Firm* — Scully, Scott, Murphy & Presser, P.C.; L. Jeffrey Kelly, Esq.

(57) ABSTRACT

A metal is formed into an opening that is located in an interlayer dielectric (ILD) material that laterally surrounds a semiconductor fin of a partially fabricated vertical transistor and on a physically exposed topmost surface of the semiconductor fin. A patterned material stack of, and from bottom to top, a membrane and a doped amorphous semiconductor material layer is formed on the metal and a topmost surface of the ILD material. A metal induced layer exchange anneal is then employed in which the metal and doped semiconductor material change places such that the doped semiconductor material is in direct contact with the topmost surface of the semiconductor fin. The exchanged doped semiconductor material, which provides a top source/drain structure of the vertical transistor, may have a different crystalline orientation than the topmost surface of the semiconductor fin.

12 Claims, 8 Drawing Sheets

(51) Int. Cl.
    *H01L 21/324*     (2006.01)
    *H01L 29/08*     (2006.01)

(56) References Cited

U.S. PATENT DOCUMENTS

| | | | |
|---|---|---|---|
| 9,099,411 B2 | 8/2015 | Hu et al. | |
| 2007/0001264 A1 | 1/2007 | Sheridan et al. | |
| 2010/0184276 A1* | 7/2010 | Maboudian | H01L 21/02672 438/486 |
| 2011/0223747 A1* | 9/2011 | Scholz | H01L 21/02532 438/482 |
| 2016/0322632 A1* | 11/2016 | Strunk | H01M 4/0404 |
| 2018/0122937 A1 | 5/2018 | Jagannathan et al. | |
| 2018/0366372 A1* | 12/2018 | Suvarna | H01L 29/0847 |
| 2020/0292611 A1* | 9/2020 | Kong | G01R 31/2642 |

OTHER PUBLICATIONS

Nast, et al., "Aluminum-induced crystallization of amorphous silicon on glass substrates above and below the eutectic temperature", Appl. Phys. Lett., published Sep. 28, 1998, pp. 3214-3216, vol. 73, No. 22.

Sarikov, A., et al., "A kinetic simulation study of the mechanisms of aluminum induced layer exchange process", Journal of Applied Physics, published online Jun. 10, 2010, p. 114318-1-114318-11, 107.

\* cited by examiner

FIG. 8

METHOD OF FORMING A TOP EPITAXY SOURCE/DRAIN STRUCTURE FOR A VERTICAL TRANSISTOR

BACKGROUND

The present application relates to a semiconductor structure and a method of forming the same. More particularly, the present application relates to a semiconductor structure including a vertical transistor that contains a top source/drain structure that is formed at a low temperature (less than 450° C.).

Conventional vertical transistors are devices where the source-drain current flows in a direction normal to the substrate surface. In such devices, a vertical semiconductor pillar (or fin) defines the channel with the source and drain located at opposing ends of the semiconductor pillar, and a gate structure located laterally adjacent the semiconductor pillar. Vertical transistors are an attractive option for technology scaling for 5 nm node and beyond.

Forming the top source/drain structure for vertical transistors is very challenging. Since the bottom source/drain structure and the gate structures are formed prior to the formation of the top source/drain structure, the top source/drain structure epitaxial formation is limited to temperatures lower than 550° C. Growing selective epitaxy at such low temperatures is very challenging, if not impossible. There is thus a need for providing a method that is capable of forming the top source/drain structure of a vertical transistor at a low temperature (less than 450° C.).

SUMMARY

A metal is formed into an opening that is located in an interlayer dielectric (ILD) material that laterally surrounds a semiconductor fin of a partially fabricated vertical transistor and on a physically exposed topmost surface of the semiconductor fin. A patterned material stack of, and from bottom to top, a membrane and a doped amorphous semiconductor material layer is formed on the metal and a topmost surface of the ILD material. A metal induced layer exchange anneal is then employed in which the metal and doped semiconductor material change places such that the doped semiconductor material is in direct contact with the topmost surface of the semiconductor fin. The exchanged doped semiconductor material provides a top source/drain structure of the vertical transistor. The exchanged doped semiconductor material may have a different crystalline orientation than the topmost surface of the semiconductor fin.

In one aspect of the present application, a method of forming a semiconductor structure is provided. In one embodiment of the present application, the method includes forming a metal into an opening that is located in an interlayer dielectric (ILD) material that laterally surrounds a semiconductor fin of a partially fabricated vertical transistor and on a physically exposed topmost surface of the semiconductor fin. A patterned material stack of, and from bottom to top, a membrane and a doped amorphous semiconductor material layer is formed on the metal and a topmost surface of the ILD material. An anneal is performed at a temperature of less than 450° C. to cause metal induced layer exchange between the metal and the doped semiconductor material that provides the doped amorphous semiconductor material layer, wherein the exchanged doped semiconductor material is crystalline and is in direct contact with the topmost surface of the semiconductor fin.

In another aspect of the present application, a semiconductor structure is provided. In one embodiment of the present application, the semiconductor structure includes a semiconductor fin extending upwards from a semiconductor mesa portion of a semiconductor substrate. A bottom source/drain structure laterally surrounds, and directly contacts, the semiconductor mesa portion of the semiconductor substrate. A bottom gate spacer laterally surrounds, and directly contacts, a bottom portion of the semiconductor fin. A gate structure laterally surrounds, and directly contacts, a middle portion of the semiconductor fin. A top gate spacer laterally surrounds, and directly contacts, a top portion of the semiconductor fin. A top source/drain structure is located on a topmost surface of the semiconductor fin. The top source/drain structure is composed of a doped semiconductor material that is crystalline and has a different crystalline orientation than the topmost surface of the semiconductor fin.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
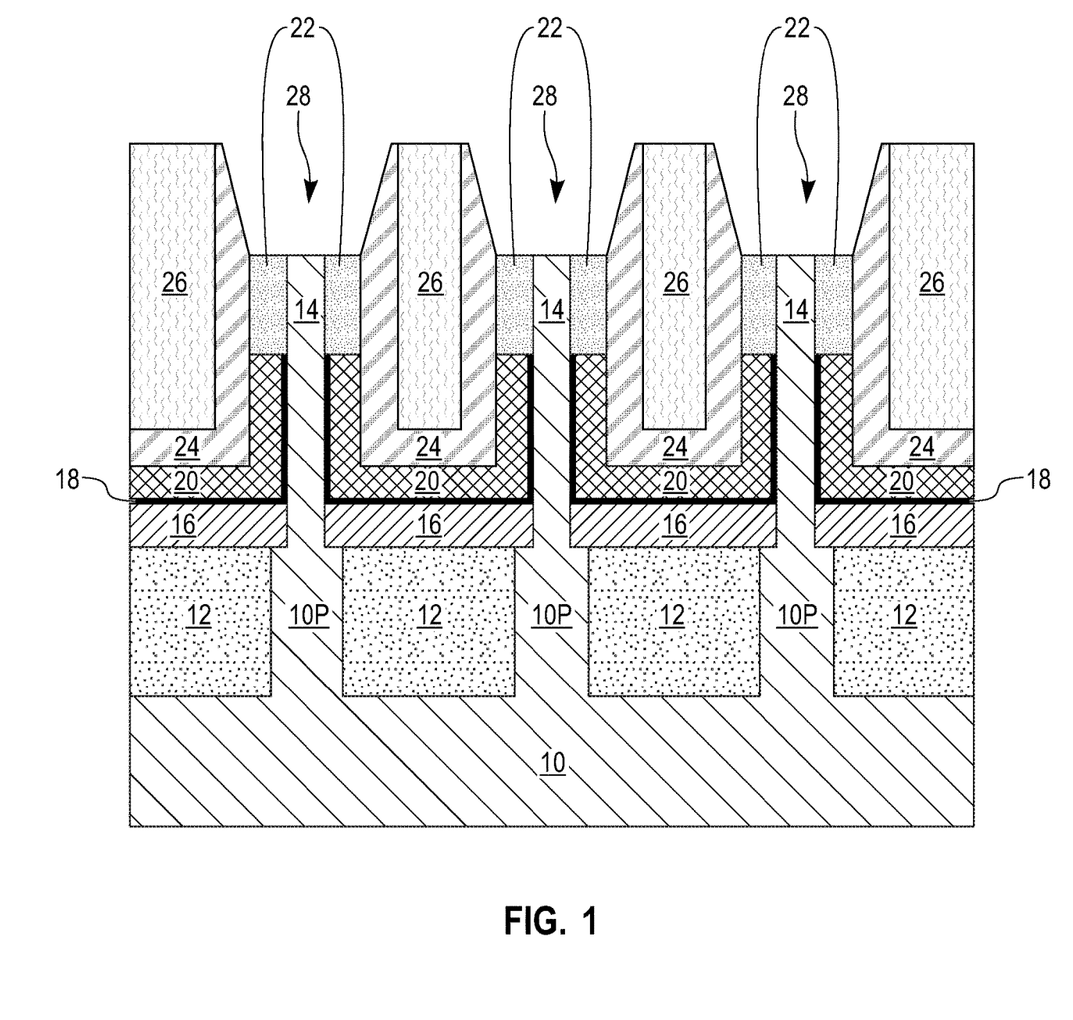
FIG. 1 is a cross sectional view of an exemplary semiconductor structure of the present application and during an early stage of fabrication, the exemplary semiconductor structure including a plurality of partially fabricated vertical transistors located on a semiconductor substrate, wherein an interlayer dielectric (ILD) material laterally surrounds each of the partially fabricated vertical transistors and wherein a topmost surface of a semiconductor fin of each partially fabricated vertical transistor is physically exposed.

Referring first to FIG. 1, there is illustrated an exemplary semiconductor structure of the present application and during an early stage of fabrication. The exemplary semiconductor structure illustrated in FIG. 1 includes a plurality of partially fabricated vertical transistors located on a semiconductor substrate 10, wherein an interlayer dielectric (ILD) material 26 laterally surrounds each of the partially fabricated vertical transistors. In some embodiments, a dielectric material liner 24 may also laterally surround each of the partially fabricated vertical transistors. In such an embodiment, the dielectric material liner 24 is located between the partially fabricated vertical transistor and the ILD material 26. As is shown, a topmost surface of a semiconductor fin 14 of each partially fabricated vertical transistor is physically exposed by an opening 28.

Although a plurality of partially fabricated vertical transistors is illustrated and described, the present application can be employed in embodiments in which a single partially fabricated vertical transistor is provided.

The exemplary semiconductor structure shown in FIG. 1 can be formed utilizing any technique that is capable of forming partially fabricated vertical transistors such as shown in FIG. 1. Such techniques, which may include various deposition steps and patterning processes, are well-known to those skilled in the art. As such, and so as not to obscure the method of the present application, the processing details of forming the partially fabricated vertical transistors shown in FIG. 1 are not provided herein.

The exemplary structure of FIG. 1 includes semiconductor substrate 10 and a semiconductor mesa portion 10P. The semiconductor substrate 10 and semiconductor mesa portion 10P are of integral construction (i.e., a same piece) and include at least one semiconductor material having semiconducting properties. The semiconductor substrate 10 and the semiconductor mesa portion 10P can be composed of a same, or a different, semiconductor material. Examples of semiconductor materials that provide the semiconductor substrate 10 and the semiconductor mesa portion 10P include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

The semiconductor material that provides the semiconductor substrate 10 and the semiconductor mesa portion 10P can be a single crystalline semiconductor material. The semiconductor material that provides the semiconductor substrate 10 and the semiconductor mesa portion 10P can have any of the well-known crystal orientations. For example, the crystal orientation of the semiconductor substrate 10 may be {100}, {110}, or {111}. Other crystallographic orientations besides those specifically mentioned can also be used in the present application.

The exemplary structure of FIG. 1 also includes a bottom source/drain structure 12, which laterally surrounds, and directly contacts, the semiconductor mesa portion 10P of the semiconductor substrate 10. The bottom source/drain structure 12 is composed of a semiconductor material, as defined above, and an n-type dopant or p-type dopant. In one embodiment, the semiconductor material that provides the bottom source/drain structure 12 can be composed of a same semiconductor material as the semiconductor mesa portion 10P and/or the semiconductor substrate 10. In another embodiment, the semiconductor material that provides the bottom source/drain structure 12 can be composed of a different semiconductor material than the semiconductor mesa portion 10P and/or the semiconductor substrate 10. The term "n-type" denotes the addition of impurities that contributes free electrons to an intrinsic semiconductor. In a silicon containing semiconductor material, examples of n-type dopants, i.e., impurities, include, but are not limited to, antimony, arsenic and phosphorous. The term "p-type" denotes the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of dopant within the bottom source/drain structure 12 can be from $1\times10^{20}$ atoms/cm$^3$ to $2\times10^{21}$ atoms/cm$^3$. Other dopant concentrations can be used so long as the dopant concentration is sufficient to form a source/drain structure.

The exemplary structure of FIG. 1 also includes a semiconductor fin 14, which extends upwards from a topmost surface of the semiconductor mesa portion 10P. The semiconductor fin 14 is composed of one of the semiconductor materials mentioned above for the semiconductor substrate 10. In one embodiment, the semiconductor fin 14 is composed of a same semiconductor material as the semiconductor substrate 10 and/or semiconductor mesa portion 10P. In another embodiment, the semiconductor fin 14 is composed of a different semiconductor material than the semiconductor substrate 10 and/or semiconductor mesa portion 10P. In some embodiments the semiconductor fin 14 is composed of a semiconductor material that can facilitate high electron mobility within the vertical transistor. The semiconductor fin 14 is typically non-doped, i.e., it is composed of an intrinsic semiconductor material. In some embodiments, the semiconductor fin 14 is lightly doped with either a p-type dopant or an n-type dopant, as defined above. The term 'lightly doped' denotes a dopant concentration not exceeding $1\times10^{18}$ atoms/cm$^3$. The semiconductor fin 14 may have a height from 20 nm to 40 nm, and a width from 6 nm to 10 nm. Other heights and/or widths that are lesser than, or greater than, the aforementioned ranges may also be used for the semiconductor fin.

The exemplary structure of FIG. 1 also includes a bottom gate spacer 16, which laterally surrounds, and directly contacts, a bottom portion of the semiconductor fin 14. The bottom gate spacer 16 can be composed of any dielectric spacer material including for example, silicon dioxide, silicon nitride or silicon oxynitride. The bottom gate spacer 16 may have a thickness from 4 nm to 10 nm. Other thicknesses that are lesser than, or greater than, the aforementioned thickness range may also be employed in the present application as the thickness of the bottom gate spacer 16. As is shown in FIG. 1, the bottom gate spacer 16 has a bottommost surface that is present on the bottom source/drain structure 12 and on a portion of the topmost surface of the semiconductor mesa portion 10P.

The exemplary structure of FIG. 1 also includes a gate structure (18, 20), which laterally surrounds, and directly contacts, a middle portion of the semiconductor fin 14. The gate structure (18, 20) is located on a topmost surface of the bottom gate spacer 16. The gate structure includes a gate dielectric 18 and a gate electrode 20. The gate dielectric 18 has a sidewall surface that directly contacts the middle portion of the semiconductor fin 14, and a bottommost surface that is located directly on the topmost surface of the bottom gate spacer 16.

The gate dielectric 18 is composed of a gate dielectric material such as, for example, an oxide, nitride, and/or oxynitride. In one example, the gate dielectric 18 can be composed of a high-k material having a dielectric constant greater than 4.0. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric 18. In one embodiment, the gate dielectric material that provides gate dielectric 18 can have a thickness in a range from 1 nm to 10 nm. Other thicknesses that are lesser than, or greater than, the aforementioned thickness range can also be employed for the gate dielectric material that provides the gate dielectric 18.

The gate electrode 20 may be composed of a conductive material such as, for example, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel suicide (NiSi)), transition metal aluminides (e.g., $Ti_3Al$, ZrAl), TaC, TaMgC, carbon nanotube, conductive carbon, graphene, or any suitable combination of these materials. The conductive material may further comprise dopants that are incorporated during or after deposition. In some embodiments, a workfunction setting layer (not shown) may be located between the gate dielectric material 18 and the gate electrode 20. The workfunction setting layer can be a workfunction metal (WFM). The WFM can be any suitable material, including but not limited to, a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), titanium aluminum carbide (TiAlC), tantalum carbide (TaC), hafnium carbide (HfC); and combinations thereof. In some embodiments, a conductive material or a combination of multiple conductive materials can serve as both the gate electrode 20 and the WFM. In one embodiment, the gate electrode 20 can have a thickness from 50 nm to 200 nm. Other thicknesses that are lesser than, or greater than, the aforementioned thickness range can also be employed for the gate electrode 20.

The exemplary structure of FIG. 1 also includes a top gate spacer 22, which laterally surrounds, and directly contacts, a top portion of the semiconductor fin 14. The top gate spacer is present on a topmost surface of the gate structure (18, 20) and typically, but not necessarily always, has a topmost surface that is coplanar with a topmost surface of the semiconductor fin 14; the topmost surface of the semiconductor 14 is however physically exposed. The top gate spacer 22 may be composed of one of the dielectric spacer materials mentioned above for the bottom gate spacer 16. In one embodiment, the top gate spacer 22 is composed of a same dielectric spacer material as the bottom gate spacer 16. In another embodiment, the top gate spacer 22 is composed of a different dielectric spacer material than the bottom gate spacer 16. The top gate spacer 22 may have a thickness from 4 nm to 10 nm. Other thicknesses that are lesser than, or greater than, the aforementioned thickness range may also be employed in the present application as the thickness of the top gate spacer 22.

As mentioned above, the exemplary semiconductor structure of FIG. 1 may also include the dielectric material liner 24. In some embodiments, the dielectric material liner 24 may be omitted. When present, the dielectric material liner 24 is composed of a dielectric material that is compositionally different from the ILD material 26. In one example, the dielectric material liner 24 may be composed of silicon nitride. The dielectric material liner 24 laterally surrounds each of the partially fabricated vertical transistors and is present on physically exposed surfaces of the gate electrode 20 and a sidewall of the top gate spacer 22. The dielectric material liner 24 has height that is greater than the height of the semiconductor fin 14.

The ILD material 26 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. In another embodiment, a self-planarizing material such as a spin-on glass (SOG) or a spin-on low-k dielectric material such as SiLK™ can be used as ILD material 26. The ILD material 26 laterally surrounds each of the partially fabricated vertical transistors and, when the dielectric material liner 24 is not present, the ILD material 26 is present on physically exposed surfaces of the gate electrode 20 and a sidewall of the top gate spacer 22. The ILD material 26 has height that is greater than the height of the semiconductor fin 14; the height of the ILD material 26 may be the same or different from the height of the dielectric material liner 26.

As is shown, an opening 28 is provided in the exemplary semiconductor structure of FIG. 1 in which a topmost surface of the semiconductor fin 14 is formed. The opening 28 is laterally surrounded by at least the ILD material 26. This opening 28 can be provided after forming the ILD material 26 by removing a sacrificial dielectric cap layer (not shown) from the topmost surface of the semiconductor fin 14.

Figure 2:
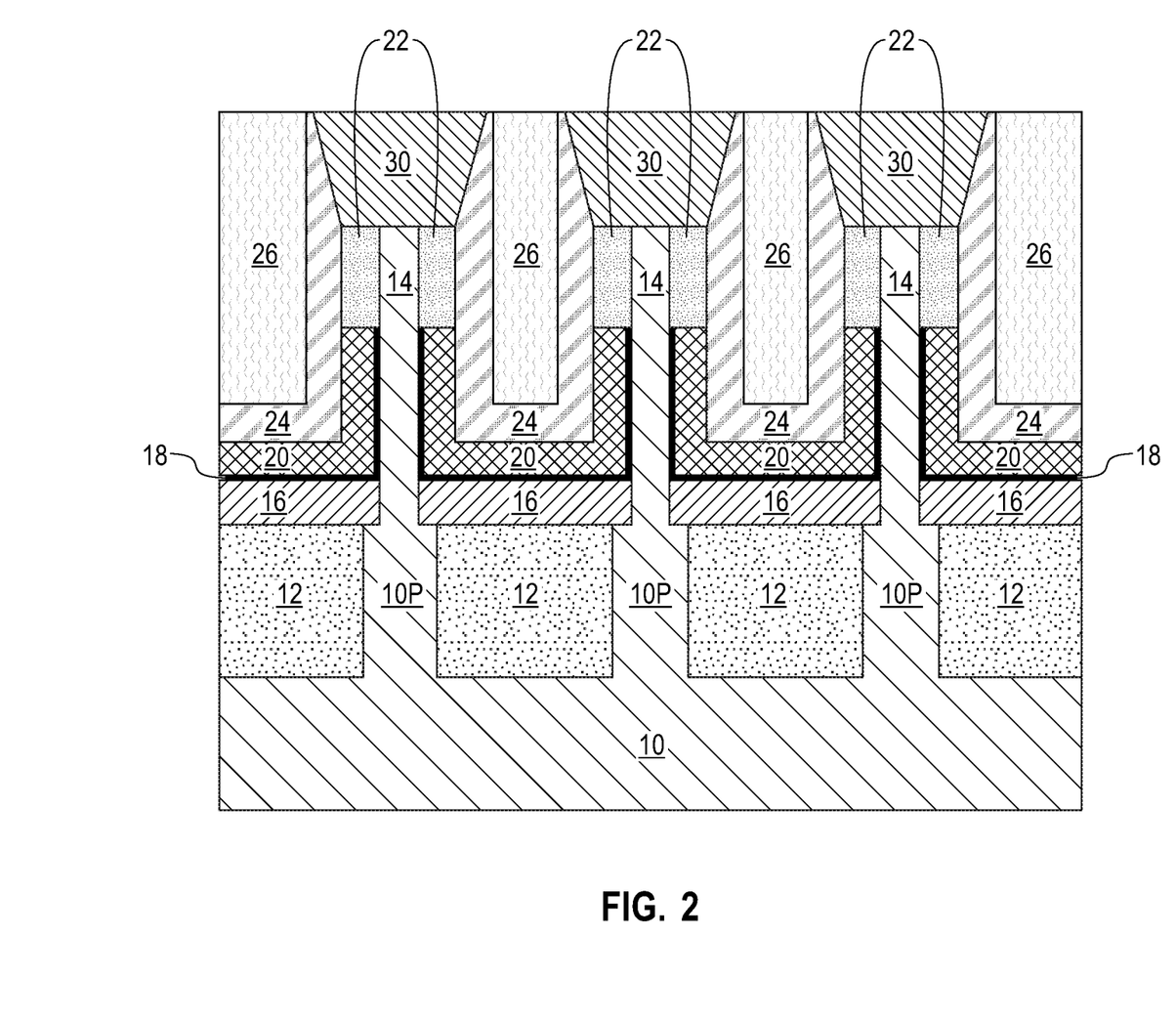
FIG. 2 is a cross sectional view of the exemplary semiconductor structure of FIG. 1 after forming a metal contacting the physically exposed topmost surface of the semiconductor fin and within an opening that is laterally surrounded by at least the ILD material.

Referring now to FIG. 2, there is illustrated the exemplary semiconductor structure of FIG. 1 after forming a metal 30 contacting the physically exposed topmost surface of the semiconductor fin 14 and within the opening 28 that is laterally surrounded by at least the ILD material 26. At this point of the present application, the metal 30 has a topmost surface that is coplanar with at least the ILD material 26. In addition to physically contacting the topmost surface of the semiconductor fin 14, the metal 30 may also contact a physically exposed topmost surface of the top gate spacer 22.

The metal 30 that is employed in the present application includes any metal that is capable of undergoing a subsequent metal induced layer exchange with an overlying doped semiconductor material. The metal 30 must also not form an alloy with the underlying semiconductor fin 14. Illustrative examples of metals that can be used as metal 30 include aluminum (Al), silver (Ag), gold (Au) or antimony (Sb). The metal 30 can be formed by depositing a layer containing the metal in the opening 28 and on the topmost surface of the ILD material 26. The layer containing the metal is then removed from the topmost surface of the ILD material 26 utilizing a planarization process such as, for example, chemical mechanical polishing and/or grinding. The layer containing the metal may be formed at a temperature below 450° C., typically below 250° C., utilizing any conventional deposition process such as, for example, chemical vapor deposition (CVD), plasma enhanced chemical vapor deposition (PECVD), atomic layer deposition (ALD) sputtering, or plating. In one embodiment, the deposition temperature for forming the layer containing the metal can be nominal room temperature. The term "nominal room temperature" denotes a temperature from 18° C. to 30° C.

Figure 3:
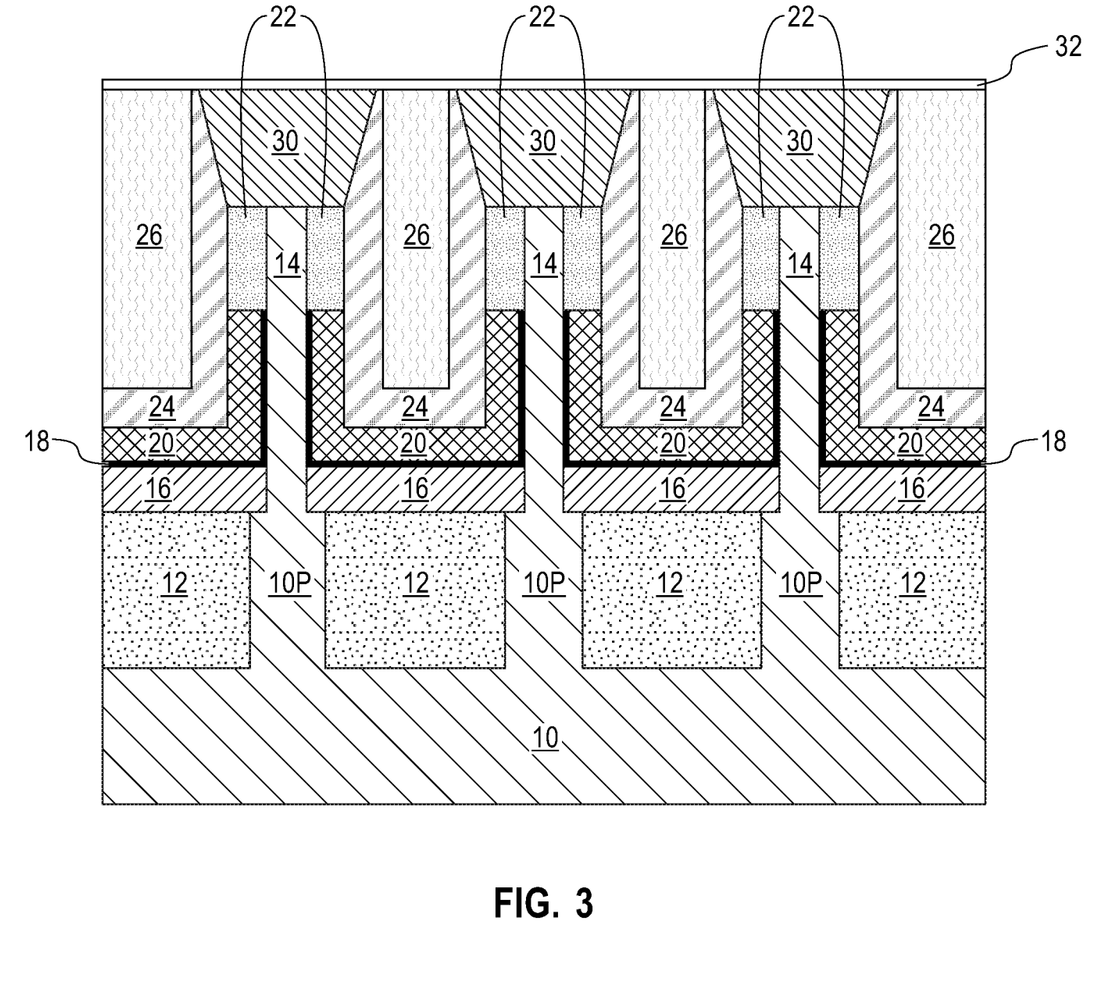
FIG. 3 is a cross sectional view of the exemplary semiconductor structure of FIG. 2 after forming a membrane on a topmost surface of the metal and a topmost surface of the ILD material.

Referring now to FIG. 3, there is illustrated the exemplary semiconductor structure of FIG. 2 after forming a membrane 32 on a topmost surface of the metal 30 and a topmost surface of the ILD material 26. The membrane 32 is composed of a dielectric material such as, for example, silicon dioxide, germanium oxide, silicon germanium oxide, or aluminum oxide. The membrane 32 has a thickness that is below 10 nm so as to allow the metal 30 to undergo a subsequent metal induced layer exchange with an overlying doped semiconductor material. In one embodiment, membrane 32 has a thickness from 0.5 nm to 5 nm.

The membrane 32 can be formed utilizing any conventional deposition process such as, for example, CVD, PECVD or ALD. The membrane can be deposited at a temperature below 450° C., typically below 250° C.

Figure 4:
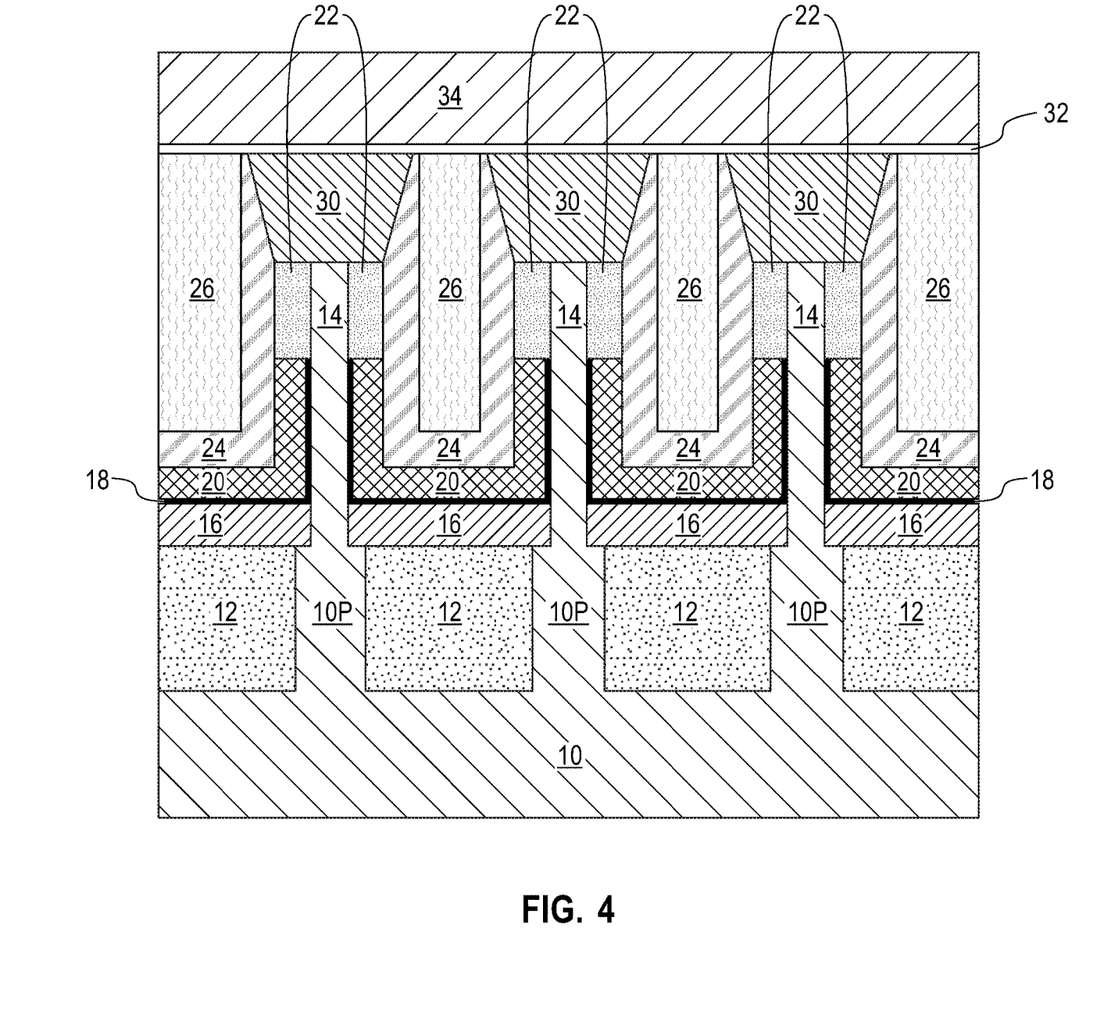
FIG. 4 is a cross sectional view of the exemplary semiconductor structure of FIG. 3 after forming a doped amorphous semiconductor material layer on the membrane.

Referring now to FIG. 4, there illustrated the exemplary semiconductor structure of FIG. 3 after forming a doped amorphous semiconductor material layer 34 on the membrane 32. The term "amorphous" denotes a material that lacks any long-range crystal order. The doped amorphous semiconductor material layer 34 is composed of one of the semiconductor materials mentioned above for semiconductor substrate 10 and a p-type or n-type dopant, as defined above.

The semiconductor material that provides the doped amorphous semiconductor material layer 34 may be a same semiconductor material as, or a different semiconductor than, the semiconductor fin 14. In one example, the semiconductor material that provides the doped amorphous semiconductor material layer 34 is composed of silicon, germanium or a silicon germanium alloy. The dopant concentration of n-type dopant or p-type dopant that is present in the doped amorphous semiconductor material layer 34 may be in a range from $1\times10^{20}$ atoms/cm$^3$ to $2\times10^{21}$ atoms/cm$^3$. Other dopant concentrations can be used in the present application so long as the dopant concentration is sufficient to provide a source/drain structure.

The doped amorphous semiconductor material layer 34 can be formed utilizing an epitaxial growth process that is performed at a temperature below 450° C., typically less than 400° C. In some embodiments, the amorphous semiconductor material layer 34 can be epitaxially grown at nominal room temperature, as defined above. The doped amorphous semiconductor material layer 34 can be formed utilizing any well-known precursor gas or gas mixture. Carrier gases like hydrogen, nitrogen, helium and argon can be used. The dopant is typically, but not necessarily always, added to the precursor gas or gas mixture. In some embodiments, a non-doped amorphous semiconductor material layer can be epitaxially grown and thereafter the dopant can be added to the non-doped amorphous semiconductor material utilizing ion implantation or gas phase doping.

The doped amorphous semiconductor material layer 34 has a thickness that is greater than the thickness of metal 30 that is formed into the opening 28. In one embodiment, and when the metal 30 has a thickness from 15 nm to 50 nm, the doped amorphous semiconductor material layer 34 has a thickness from 15 nm to 100 nm.

Figure 5:
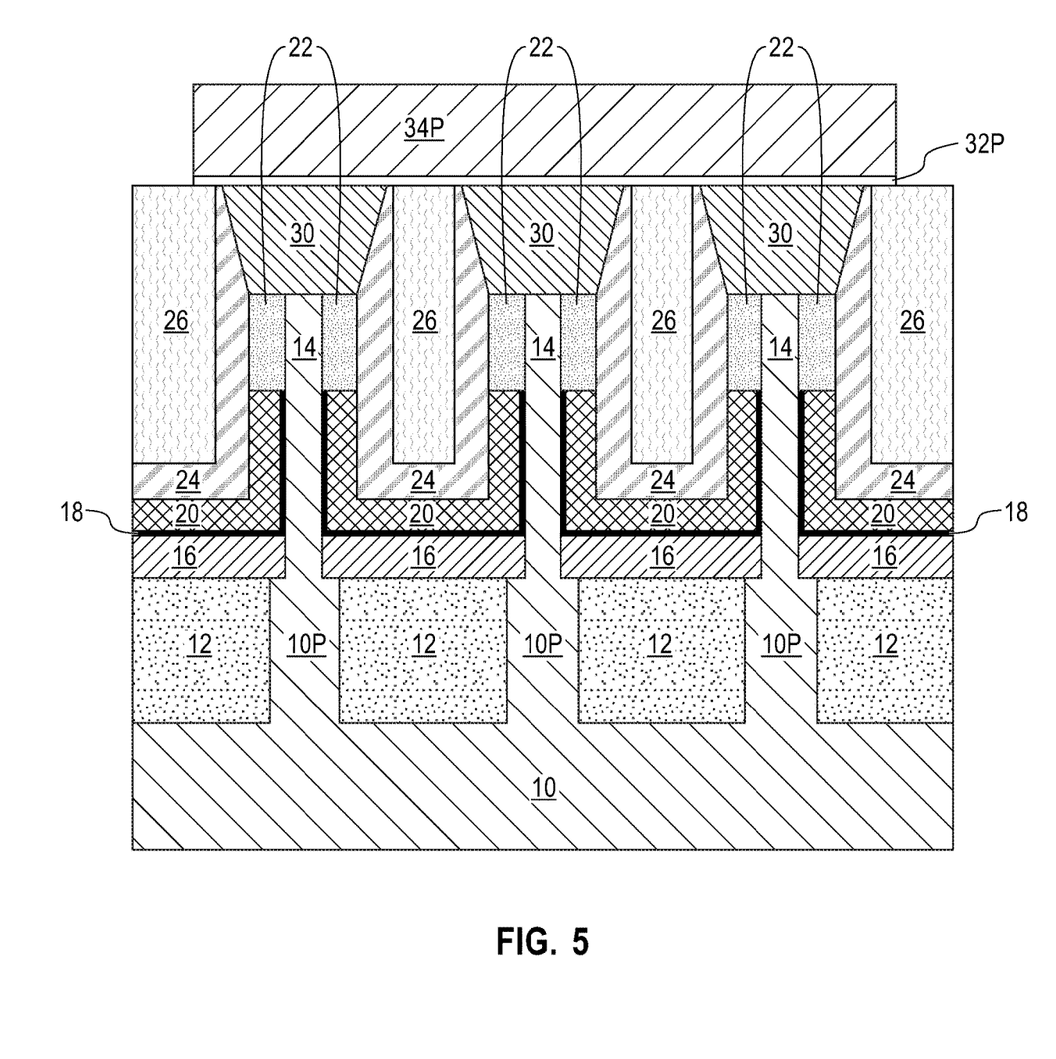
FIG. 5 is a cross sectional view of the exemplary semiconductor structure of FIG. 4 after patterning the doped amorphous semiconductor material layer and the membrane.

Referring now to FIG. 5, there is illustrated the exemplary semiconductor structure of FIG. 4 after patterning the doped amorphous semiconductor material layer 34 and the membrane 36. A patterned material stack is provided. The remaining portion of the doped amorphous semiconductor material layer after patterning is designated as element 34P in FIG. 5 of the present application, wherein the remaining portion of the membrane 32 after patterning is designated as element 32P in FIG. 5 of the present application. The patterning, which defines an isolated device, can be performed by lithography and etching. Lithography includes forming a photoresist material on a material or material stack that needs to be patterned, exposing the photoresist material to a pattern of irradiation, and developing the exposed photoresist material utilizing a conventional photoresist developer. The etch may include an anisotropic dry etch or wet etch.

Figure 6:
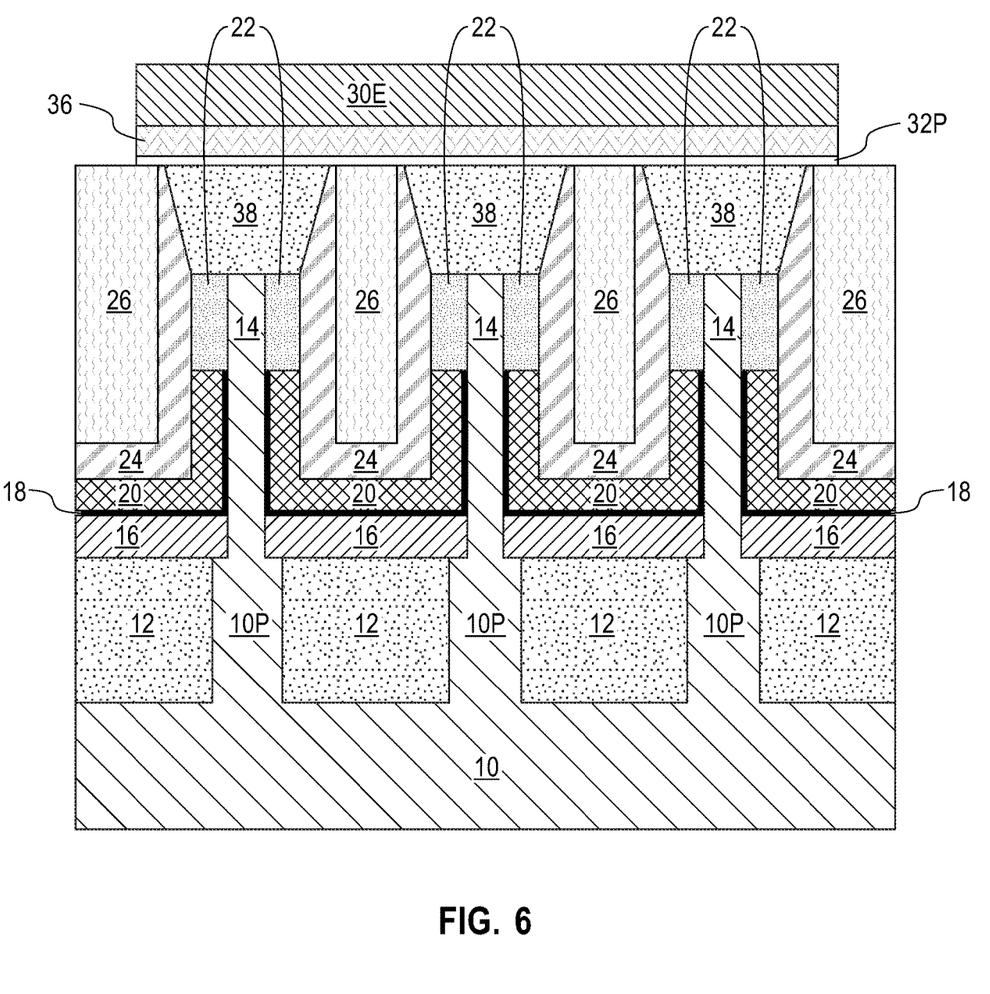
FIG. 6 is a cross sectional view of the exemplary semiconductor structure of FIG. 5 after performing a low temperature anneal to trigger metal induced layer exchange and to provide a top source/drain structure composed of a doped semiconductor material in direct contact with the topmost surface of the semiconductor fin.

Referring now to FIG. 6, there is illustrated the exemplary semiconductor structure of FIG. 5 after performing a low temperature anneal (below 450° C.) to trigger metal induced layer exchange and to provide a top source/drain structure 38 composed of a doped semiconductor material in direct contact with the topmost surface of the semiconductor fin 14. That is, this low temperature anneal causes the metal 30 and the doped semiconductor material to change (i.e., swap) locations such that exchanged metal 30E is located above membrane 32P and the exchanged doped semiconductor material that provides the top source/drain structure 38 is located beneath the membrane 32P and in direct physical contact with the topmost surface of the semiconductor fin 14.

The low temperature anneal also causes phase conversion of the amorphous semiconductor material to a crystalline semiconductor material. Thus, the exchanged doped semiconductor material that provides the top source/drain structure 38 is crystalline. The exchanged doped semiconductor material that provides the top source/drain structure 38 includes the same dopant type and substantially the same (i.e., within ±5%) dopant concentration as the doped amorphous semiconductor material layer 34. In some embodiments, the exchanged doped semiconductor material that provides the top source/drain structure 38 has a different crystalline orientation than the topmost surface of the semiconductor fin 14. In one embodiment, and as shown in FIG. 6, a layer composed of a metal/semiconductor mixture 36 is formed between the membrane 32P and the exchanged metal 30E. In another embodiment, layer 36 is not formed.

In one embodiment, the low temperature anneal is performed at a temperature of from 200° C. to 400° C. The low temperature anneal is performed in an inert ambient such as, for example, helium (He), argon (Ar), neon (Ne), nitrogen ($N_2$) or any combination thereof.

Notably, FIG. 6 (as well as FIGS. 7-8) illustrates an exemplary semiconductor structure (with a completely fabricated vertical transistor(s)) of the present application that includes a semiconductor fin 14 extending upwards from a semiconductor mesa portion 10P of a semiconductor substrate 10. A bottom source/drain structure 12 laterally surrounds, and directly contacts, the semiconductor mesa portion 10P of the semiconductor substrate 10. A bottom gate spacer 16 laterally surrounds, and directly contacts, a bottom portion of the semiconductor fin 14. A gate structure (18, 20) laterally surrounds, and directly contacts, a middle portion of the semiconductor fin 14. A top gate spacer 22 laterally surrounds, and directly contacts, a top portion of the semiconductor fin 14. A top source/drain structure 38 is located on a topmost surface of the semiconductor fin 14. The top source/drain structure 38 is composed of a doped semiconductor material that is crystalline. In some embodiments, the doped semiconductor material that provides the top source/drain structure 38 has a different crystalline orientation than the topmost surface of the semiconductor fin 14. Dielectric material liner 24 and/or interlayer dielectric material 26 may laterally surround the gate structure (18, 20) and the top source/drain structure 38. In some embodiments, and as is shown in FIG. 6 (as well as FIGS. 7-8), the top source/drain structure 38 has tapered sidewalls, a bottom portion having a first width, and an upper portion having a second width that is greater than the first width.

Figure 7:
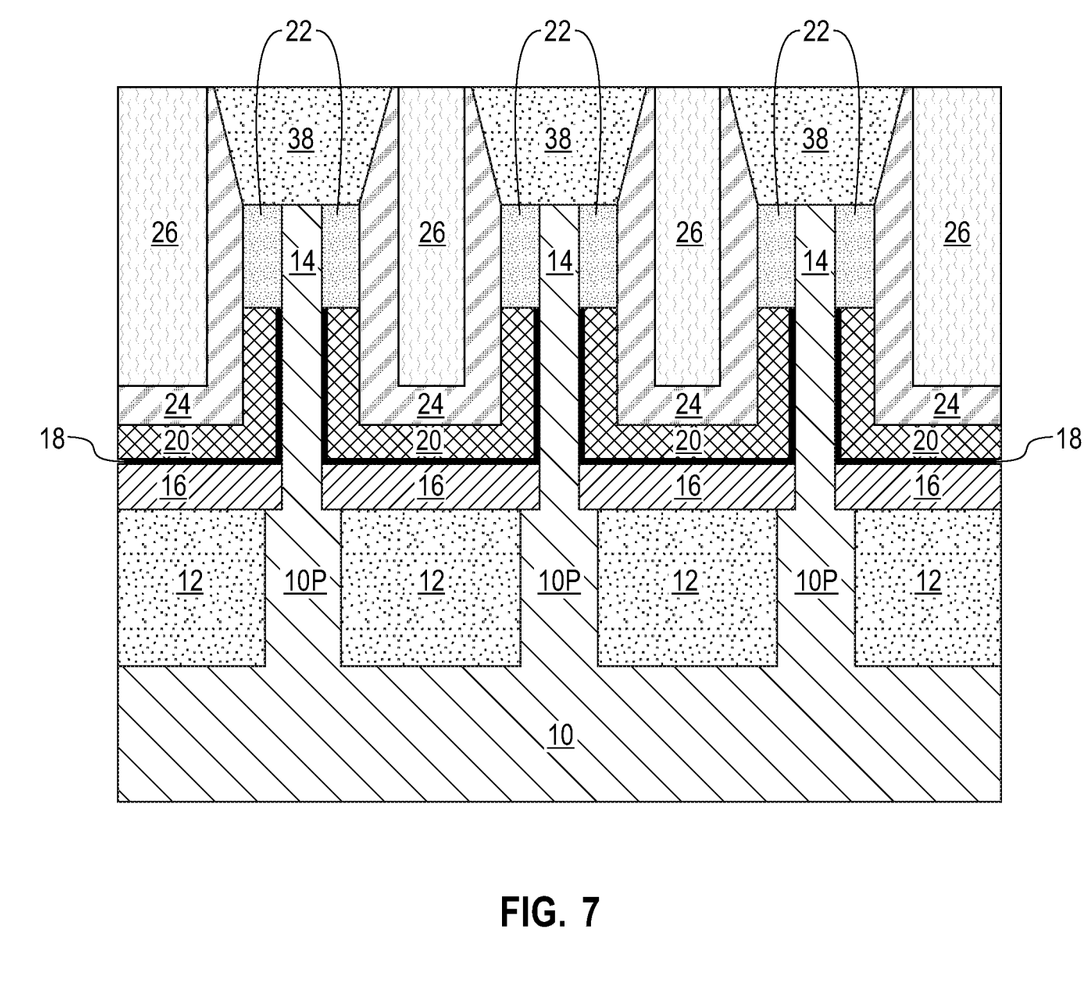
FIG. 7 is a cross sectional view of the exemplary semiconductor structure of FIG. 6 after removing the exchanged metal and the patterned membrane from the topmost surface of the ILD material and the top source/drain structure.

Referring now to FIG. 7, there is illustrated the exemplary semiconductor structure of FIG. 6 after removing the exchanged metal 30R and the patterned membrane 32P from the topmost surface of the ILD material 26 and the top source/drain structure 38. In embodiments in which layer 36 is present, the layer that is composed of a metal/semiconductor mixture 36 is also removed from the structure. The removal of the exchanged metal 30R, if present, layer 36, and the patterned membrane 32P may be performed utilizing one or more material removal processes. In one example, a planarization process can be used as the one or more material removal processes. In another embodiment, dry etching and/or wet etching may be used as the one or more removal processes. In yet another embodiment, a planarization and at least one etching process may be used to remove the exchanged metal 30R, if present, layer 36, and the patterned membrane 32P from the structure. After removal of the exchanged metal 30R, if present, layer 36, and the patterned membrane 32P, a physically exposed surface of the top source/drain structure 38 is exposed. At this point of the present application, the physically exposed topmost surface of the top source/drain structure 38 is coplanar with a topmost surface of at least the ILD material 26.

Figure 8:
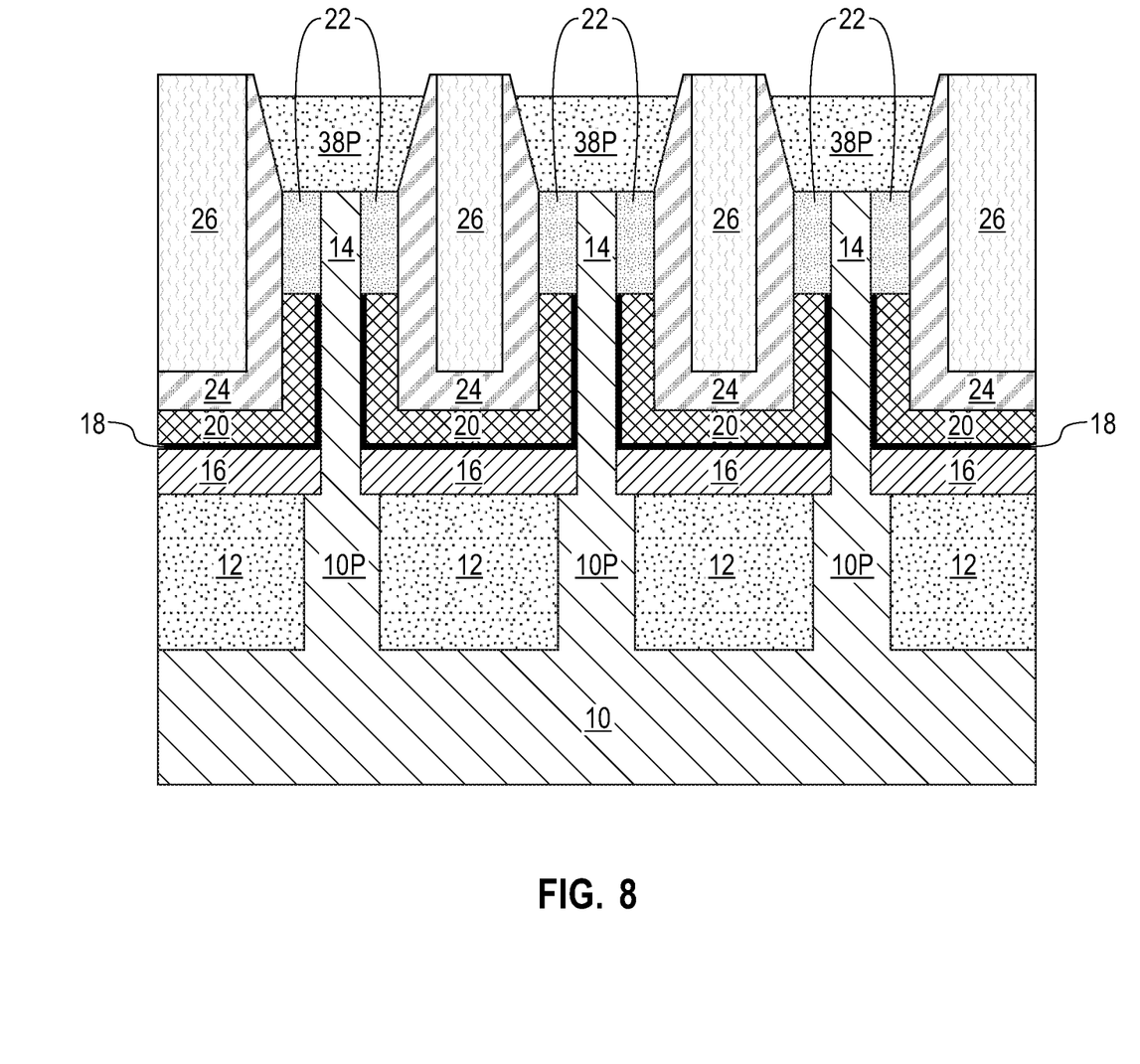
FIG. 8 is a cross sectional view of the exemplary semiconductor structure of FIG. 7 after recessing the top source/drain structure.

Referring now to FIG. 8, there illustrated that the exemplary semiconductor structure of FIG. 7 after recessing the top source/drain structure 38 to provide a recessed top source/drain structure 38P. The recessed top source/drain structure 38P has a topmost surface that is located beneath a topmost surface of the ILD material 26. Recessing of the top source/drain structure 38 may be performed utilizing an etching process that is selective in removing an upper portion of the top source/drain structure 38. The recess unmerges a top source/drain structure of one vertical transistor from a top source/drain structure of a neighboring vertical transistor.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
    forming a metal into an opening that is located in an interlayer dielectric (ILD) material, wherein the ILD material laterally surrounds a semiconductor fin of a partially fabricated vertical transistor and is directly on a physically exposed topmost surface of the semiconductor fin, and wherein the metal completely fills the opening and has a topmost surface that is coplanar with a topmost surface of the ILD material;
    forming a patterned material stack of, and from bottom to top, a membrane and a doped amorphous semiconductor material layer on the metal and the ILD material, wherein the membrane has a bottommost surface directly contacting the topmost surface of both the ILD material and the metal; and
    performing an anneal at a temperature of less than 450° C. to cause metal induced layer exchange between the metal and the doped amorphous semiconductor material layer and to form an exchanged doped semiconductor material, wherein the exchanged doped semiconductor material is crystalline and is in direct physical contact with the topmost surface of the semiconductor fin.

2. The method of claim 1, wherein the metal is composed of aluminum (Al), silver (Ag), gold (Au) or antimony (Sb).

3. The method of claim 1, wherein the forming the metal comprises:
    depositing, at a temperature below 450° C., a layer containing the metal in the opening and on the topmost surface of the ILD material; and
    removing the layer containing the metal from the topmost surface of the ILD material.

4. The method of claim 1, wherein the membrane is composed of a dielectric material and has a thickness that is below 10 nm.

5. The method of claim 1, wherein the doped amorphous semiconductor material layer includes an n-type dopant and is composed of silicon, germanium, or a silicon germanium alloy.

6. The method of claim 1, wherein the doped amorphous semiconductor material layer includes a p-type dopant and is composed of silicon, germanium, or a silicon germanium alloy.

7. The method of claim 1, wherein the doped amorphous semiconductor material layer is formed utilizing a growth process that is performed at a temperature below 450° C.

8. The method of claim 1, wherein the temperature of the anneal is from 200° C. to 400° C., and the anneal is performed in an inert ambient.

9. The method of claim 1, wherein the anneal forms a layer of a metal/semiconductor mixture between the membrane and the exchanged metal.

10. The method of claim 1, wherein the exchanged doped semiconductor material has a different crystalline orientation than the topmost surface of the semiconductor fin.

11. The method of claim 1, further comprising removing the membrane and the exchanged metal after the anneal.

12. The method of claim 11, further comprising recessing, after the removal of the membrane and the exchanged metal, the exchanged doped semiconductor material below the topmost surface of the ILD material.

\* \* \* \* \*